United States Patent [19]

Funami et al.

[11] Patent Number: 5,502,383

[45] Date of Patent: Mar. 26, 1996

[54] CONTROLLER FOR HALL EFFECT SENSOR USING CYCLICALLY VARYING POWER

[75] Inventors: Yasuo Funami; Manabu Nishi; Yoshimi Watanabe; Shunya Senda, all of Gyoda, Japan

[73] Assignee: Showa Corporation, Japan

[21] Appl. No.: 255,168

[22] Filed: Jun. 7, 1994

[30] Foreign Application Priority Data

Jun. 10, 1993 [JP] Japan ................... 5-163842

[51] Int. Cl.⁶ .................. G01R 33/07; G01B 7/14; F15B 15/28; B63H 25/00
[52] U.S. Cl. .............. 324/251; 73/DIG. 3; 310/DIG. 3; 324/207.2; 327/511
[58] Field of Search ................ 324/117 H, 207.2, 324/207.21, 207.24, 235, 251, 252; 73/DIG. 3; 327/510, 511; 310/DIG. 3; 323/368; 440/61; 114/150

[56] References Cited

U.S. PATENT DOCUMENTS 3,661,089  5/1972  Soltz ................... 324/251 X
4,097,802  6/1978  Mahopac ................ 324/252
4,327,416  4/1982  Jerrim ................ 324/251 X
4,520,311  5/1985  Petr et al. ............ 324/252 X
4,595,370  6/1986  Small .
4,976,639  12/1990  Rawlings et al. .
5,264,783  11/1993  Vig et al. ............. 324/117 H X

FOREIGN PATENT DOCUMENTS 61-123910  4/1986  Japan .
63-279101  11/1988  Japan .

*Primary Examiner*—Gerard R. Strecker
*Attorney, Agent, or Firm*—Frishauf, Holtz, Goodman, Langer & Chick

[57] ABSTRACT

A controller for a Hall effect sensor includes a sensor section including a Hall effect sensor with a hysteresis set in the output electric signal characteristic with respect to the magnetic flux density, a power supply section for supplying a source power to the Hall effect sensor, and a signal processor for processing a signal output from the sensor section. The power supply section supplies power with a voltage, which is varied cyclically in a predetermined range and is increased gradually, to the Hall effect sensor.

5 Claims, 10 Drawing Sheets

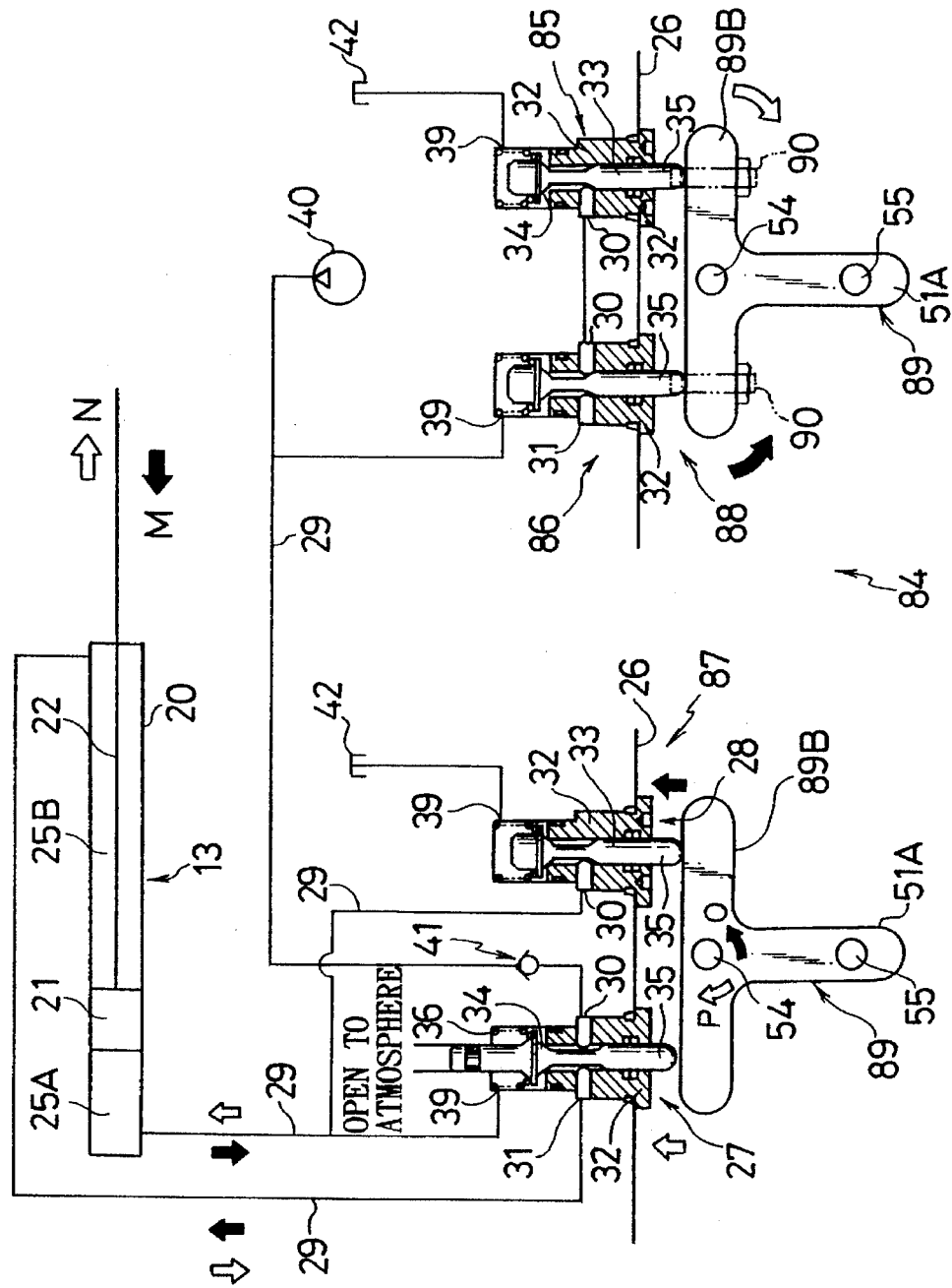

5,502,383

CONTROLLER FOR HALL EFFECT SENSOR USING CYCLICALLY VARYING POWER

BACKGROUND OF THE INVENTION

1. Field of the Invention

This invention relates to a controller for a Hall effect sensor for changing output characteristics, particularly the hysteresis width, of the Hall effect sensor.

2. Description of the Background Art

Among the sensors for detecting the displacement or position of objects, there is a Hall effect sensor which uses a Hall element. For example, as the Hall effect sensor element there is a Hall IC. Such a Hall effect sensor uses a permanent magnet or the like disposed on an object and detects the position or displacement of the object by converting the change in magnetic flux density varying in correspondence to the movement of the object into an output voltage change.

For example, when a Hall IC receives a magnetic flux density above an operating magnetic flux density, it provides a "low" output voltage, i.e., an "on" signal. On the other hand, when it receives a magnetic flux density below a restoration magnetic flux density, it provides a "high" output voltage, i.e., an "off" signal.

In the above Hall IC or like Hall effect sensor, a hysteresis, which has a hysteresis width between the operating magnetic flux density and the restoration magnetic flux density, is set in its output characteristic in order to prevent the phenomenon of chattering. Therefore, the Hall IC or like Hall effect sensor can not provide the "on" and "off" signals unless the magnetic flux density is varied beyond the hysteresis width noted above. This means that if the displacement of the object with a permanent magnet, for instance, set thereon is small, it can not be detected with the Hall IC.

SUMMARY OF THE INVENTION

An object of the invention, which has been intended in view of the above circumstances, is to provide a Hall effect sensor, in which a hysteresis is set in the characteristic of the output electric signal with respect to the magnetic flux density, and which permits reduction of the width of the hysteresis to permit detection of even a slight change in the magnetic flux density.

To attain the above object of the invention, there is provided a controller for a Hall effect sensor comprising a sensor section including a Hall effect sensor which converts a change of magnetic flux density to a change of an output voltage so as to output an electric signal, and detects the magnetic flux density, a power supply section connected to the sensor section to supply a power source to the Hall effect sensor, and a signal processing section connected to the sensor section to process signals output from the sensor section, wherein a hysteresis of the Hall effect sensor is set as an output characteristic of the output voltage corresponding to the magnetic flux density, and the power supply section supplies to the Hall effect sensor a power source which cyclically changes in a range of specified values in a positive or negative area and gradually increases in a first half of each cycle, such that the Hall effect sensor outputs an "off" signal when the magnetic flux density which acts on the Hall effect sensor remains in the width of the hysteresis and an "on" signal when the magnetic flux density remains above the upper limit of the width of the hysteresis.

In a preferred embodiment of the invention, the signal processor processes a periodically varying electric signal provided from the Hall effect sensor into a substantially constant signal.

Hall effect sensors include a type of Hall effect sensor which outputs an "off" signal upon the output voltage of the Hall effect sensor becoming high when the voltage of the power source to be supplied to the Hall effect sensor is gradually increased after the voltage has been lowered once, even though the magnetic flux density does not change while the magnetic flux density remains in the width of hysteresis between the operation magnetic flux density and the restoration magnetic flux density due to the characteristics of the circuit.

When a power source, the voltage of which cyclically changes in the range of specified values and gradually increases in the first part of each cycle is supplied to the Hall effect sensor as described above, the Hall effect sensor outputs the "off" signal even though the magnetic flux density does not change while the magnetic flux density remains in the width of hysteresis between the operation magnetic flux density and the restoration magnetic flux density. Therefore, the hysteresis width of the output characteristic of the output voltage ("on" signal and "off" signal) corresponding to the magnetic flux density can be set to be smaller and consequently a slight change of the magnetic flux density can be detected.

BRIEF DESCRIPTION OF THE DRAWINGS

The present invention will be more fully understood from the detailed description given below and from the accompanying drawings which should not be taken to be a limitation on the invention, but for explanation and understanding only.

The drawings:

FIGS. 7A, 7B-1, 7B-2, 7C, 7D and 7E are graphs showing the voltage or signal at various points in the electric circuit shown in FIG. 6;

FIG. 11 is an oil hydraulic circuit diagram showing a first modification applied to the steering system for a boat propelling apparatus;

DESCRIPTION OF THE PREFERRED EMBODIMENTS

Now, a first embodiment of the invention will be described with reference to FIGS. 1 to 10.

Figure 1:
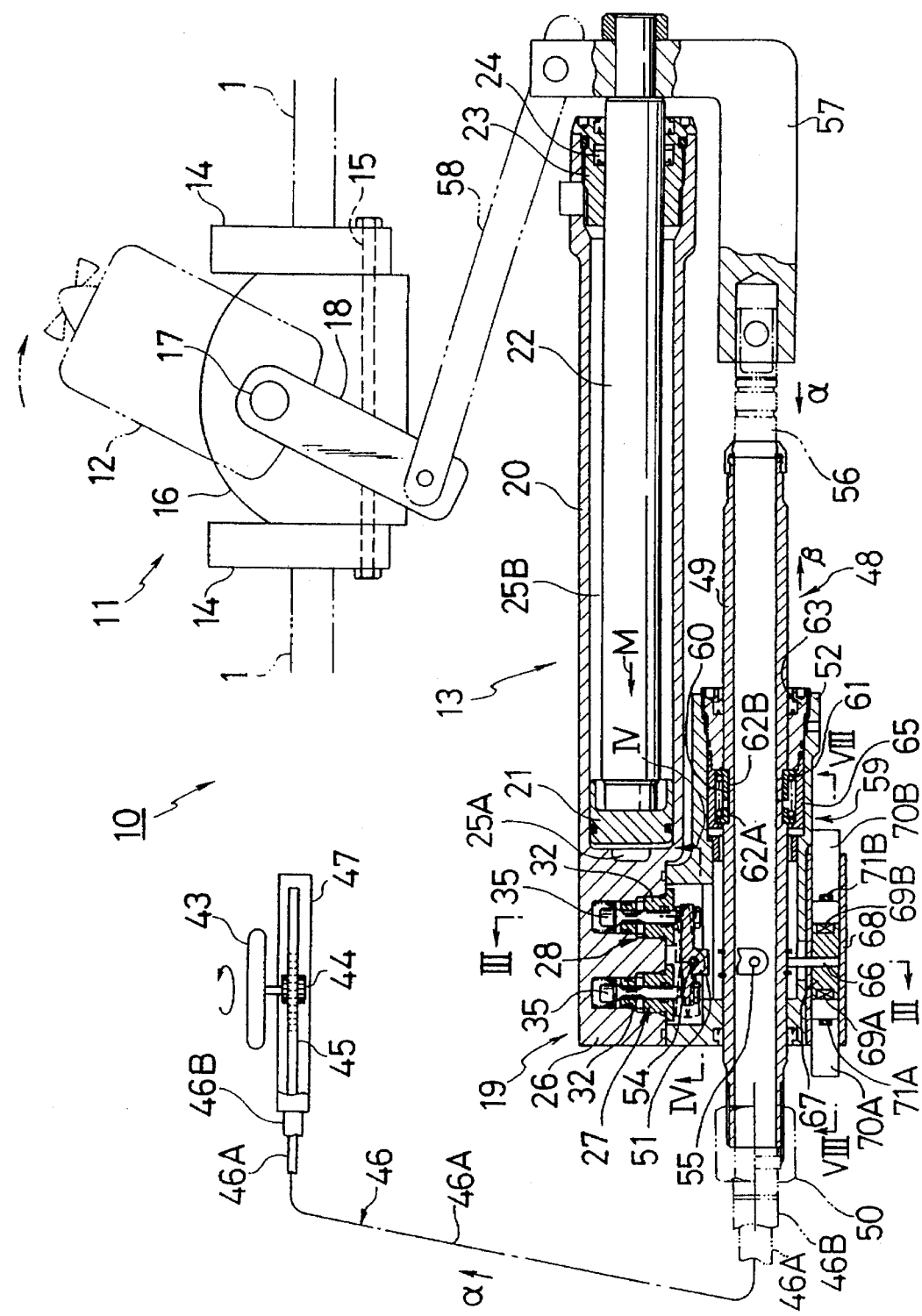
FIG. 1 is a sectional view showing a steering system for a boat propelling apparatus incorporating an embodiment of the controller for a Hall effect sensor according to the invention together with an outboard motor.

Referring to FIG. 1, there is shown a steering system 10, which steers a propelling unit 12 of an outboard motor 11 with an oil hydraulic pressure of operating fluid from a steering piston-and-cylinder assembly 13. The outboard motor 11 has a clamp bracket 14 secured to the boat 1. A swivel bracket 16 is tiltably supported via tillable shaft 15 on the clamp bracket 14. A steering shaft 17 is rotatably supported on the swivel bracket 16. The propelling unit 12 is secured to the steering shaft 17. A steering arm 18 is provided such that it is integral with the steering shaft 17 and extends away from propelling unit 12. The propelling unit 12 is steered by rocking the steering arm 18.

The steering piston-and-cylinder assembly 13 is mounted on the swivel bracket 16. A fluid switching unit 19 is disposed on one side of the steering piston-and-cylinder assembly 13. In the steering piston-and-cylinder assembly 13, a piston 21 is disposed for reciprocation in a cylinder 20. A piston rod 22 is integral with the piston 21. A cylinder cap 23 is screwed into an end of the cylinder 20 in which the piston rod 22 is received. The piston rod 22 penetrates the cylinder cap 23 such that it can project therefrom. A seal ring 24 is fitted in the inner periphery of the cylinder cap 23. The interior of the cylinder 20, which is sealed by the seal ring 24, is partitioned by the piston 21 into a left and a right chamber 25A and 25B.

Figure 2:
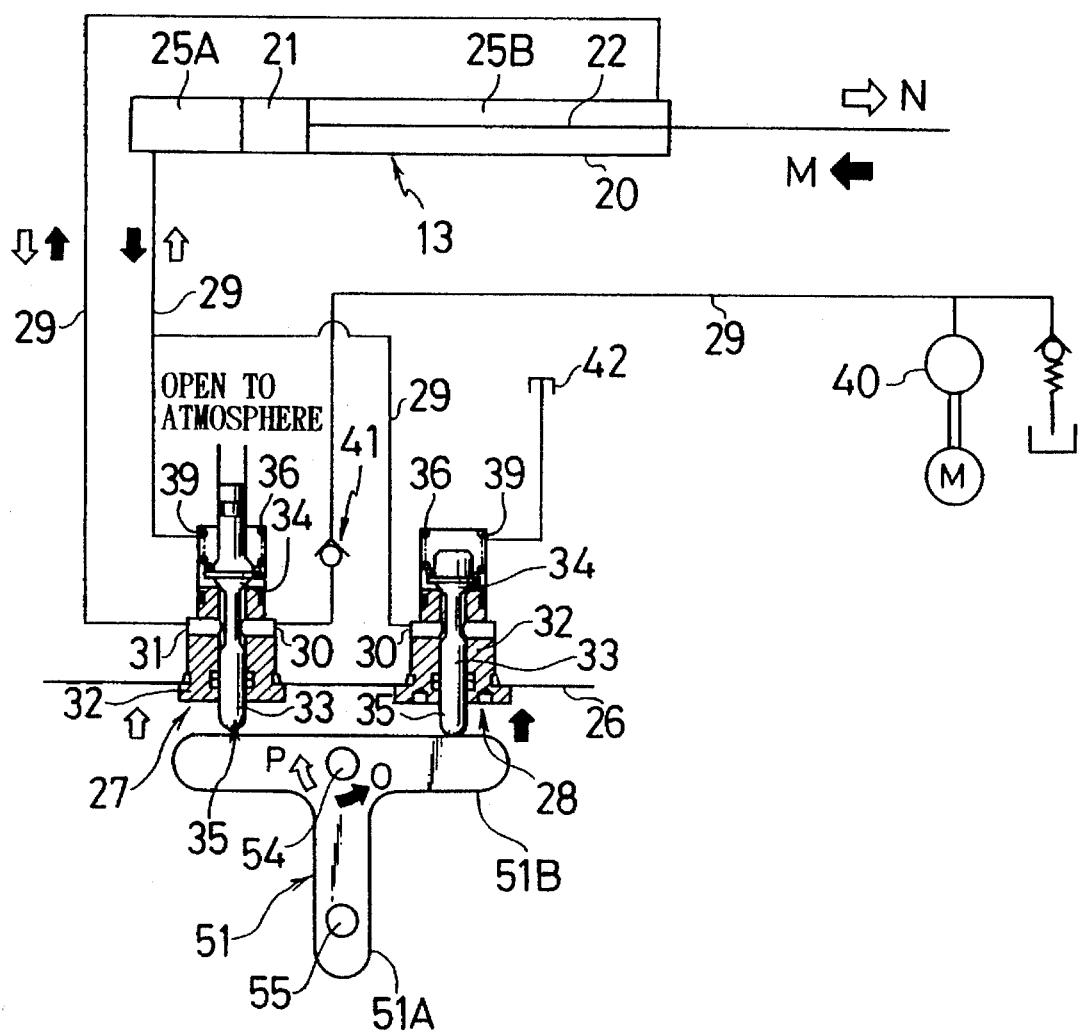
FIG. 2 is an oil hydraulic circuit diagram showing an oil hydraulic circuit of the steering system shown in FIG. 1.

The oil hydraulic operating fluid switching unit 19 includes a housing 26, a pair of switching poppet valves, i.e., a first and a second switching poppet valve 27 and 28, and an operating fluid path 29 (FIG. 2). The housing 26 is secured to an end of the cylinder 20 from which the piston rod 22 does not project.

Figure 5:
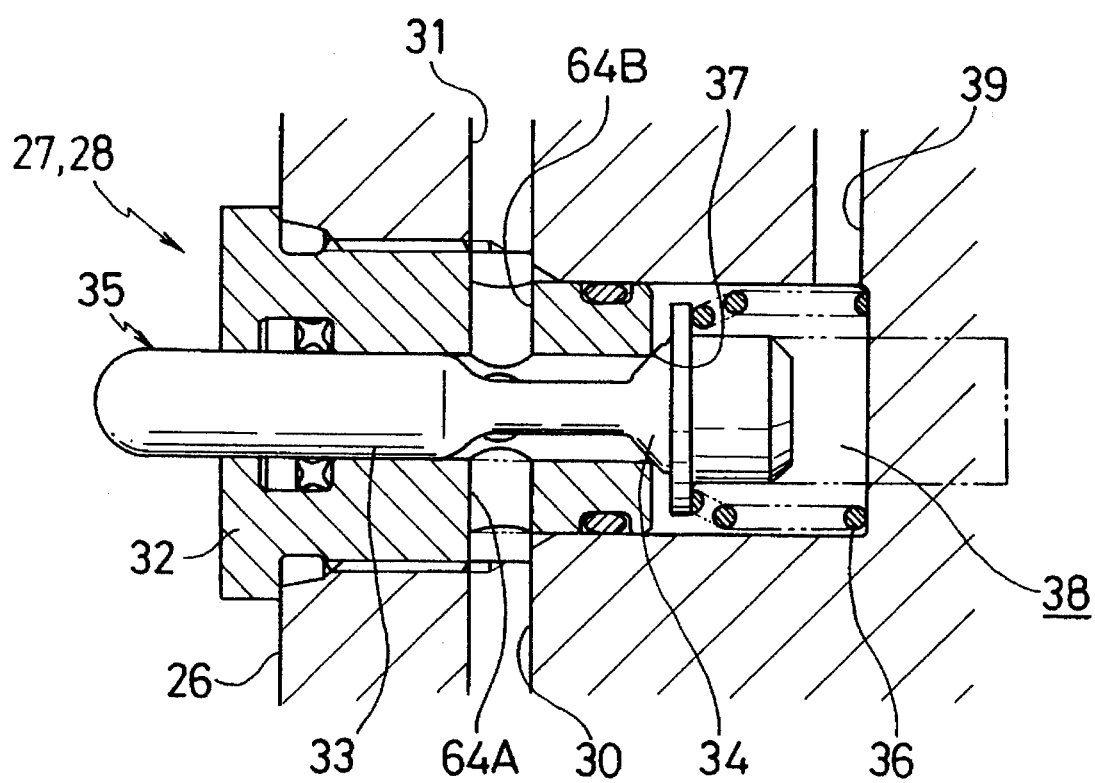
FIG. 5 is an enlarged-scale sectional view showing a poppet valve shown in FIG. 1.

As shown in FIG. 5, the first and second switching poppet valves 27 and 28 each comprise a valve case 32 with flow paths 64A and 64B formed therein and a poppet 35 slidably disposed in the valve case 32 and having valve sections 33 and 34. Port 31 and flow path 64B are formed in the first switching poppet valve 27 only. The flow paths 64A and 64B are communicated with respective ports 30 and 31 of the housing 26. The ports 30 and 31 are normally in a communicated state with each other.

The valve section 34 can be brought into contact with a valve seat 37 by a spring force of a valve spring 36. The housing 26 has a valve chamber 38, in which the valve spring 36 is disposed, and which is formed with a port 39. With the valve section 34 brought into contact with the valve seat 37 by the biasing force of the valve spring 36, the port 39 is blocked from communication with the ports 30 and 31. With the valve section 34 brought away from the valve seat 37, the port 39 is communicated with the ports 30 and 31.

The operating fluid path 29, as shown in FIG. 2, connects an operating fluid supply pump 40 via a check valve 41 to the port 30 of the first switching poppet valve 27. The port 31 of the first switching poppet valve 27 is connected via the operating fluid path 29 to the fight chamber 25B of the steering piston-and-cylinder assembly 13. The port 39 of the first switching poppet valve 27 is connected via the operating fluid path 29 to the left chamber 25A of the steering piston-and-cylinder assembly 13. Through the first switching poppet valve 27, oil hydraulic operating fluid is supplied from the operating fluid supply pump 40 to the steering piston-and-cylinder assembly 13.

The port 30 of the second switching poppet valve 28 is connected via the operating fluid path 29 to the left chamber 25A of the steering piston-and-cylinder assembly 30. The port 39 of the second switching poppet valve 28 is connected to a drain tank 42. Thus, the second switching poppet valve 28 controls the flow of operating fluid directed from the steering piston-and-cylinder assembly 13 to the drain tank 42.

The poppets 35 of the first and second switching poppet valves 27 and 28 are selectively pushed by a switching lever 51 to be described later in detail. When the poppet 35 of the second switching poppet valve 28 is pushed as switching lever 51 moves in the direction shown by black arrow O, the ports 30 and 39 of the second switching poppet valve 28 are communicated with each other. Thus, operating fluid from the operating fluid supply pump 40 is supplied through the ports 30 and 31 of the first switching poppet valve 27 to the right chamber 25B of the steering piston-and-cylinder assembly 13. At this time, operating fluid in the left chamber 25A of the steering piston-and-cylinder assembly 13 is led to the port 30 of the second switching poppet valve 28 and thence through the port 39 thereof to the drain tank 42. Thus, the piston rod 22 of the steering piston-and-cylinder assembly 13 is contracted as piston 21 moves in the direction of black arrow M.

When the poppet 35 of the first switching poppet valve 27 is pushed due to switching lever 51 being moved in the direction of white arrow P, the ports 30 and 31 of the first switching poppet valve 27 are communicated with the port 39 thereof. At this time, the operating fluid from the operating fluid supply pump 40 is led through the port 30 of the first switching poppet valve 27 to the ports 39 and 31 and thence to the left and right chambers 25A and 25B in the steering piston-and-cylinder assembly 13. Since at this time the area of pressure reception in the piston 21 of the steering piston-and-cylinder assembly is greater on the side of the left chamber 25A than the side of the right chamber 25B, the piston rod 22 is extended in the direction of white arrow N, thus forcing the operating fluid in the right chamber 25B through the port 31 of the first switching poppet valve 27 to the port 39 and thence to the left chamber 25A of the steering piston-and-cylinder assembly 13.

When the poppet 35 of neither the first nor the second switching poppet valve 27 or 28 is pushed and also the operating fluid supply pump 40 is stopped (as will be described later), the check valve 41 blocks the flow of operating fluid irrespective of application of an external force to the piston rod 22 of the steering piston-and-cylinder assembly 13, thus preventing the operation of the piston rod 22.

Referring back to FIG. 1, a steering wheel 43 is installed in a driver's seat in the boat 1. The steering wheel 43 has a pinion 44. A rack bar 45 is in mesh with the pinion 44. An inner cable 46A of an operating cable 46 is connected to the rack bar 45. The operating cable 46 comprises the inner cable 46A and an outer cable 46B covering the inner cable 46A. A rack bar housing 47 is secured to one end of the outer cable 46B, the other end of which is connected via a blind nut 50 to a cable guide 49 of an operation unit 48.

Figure 3:
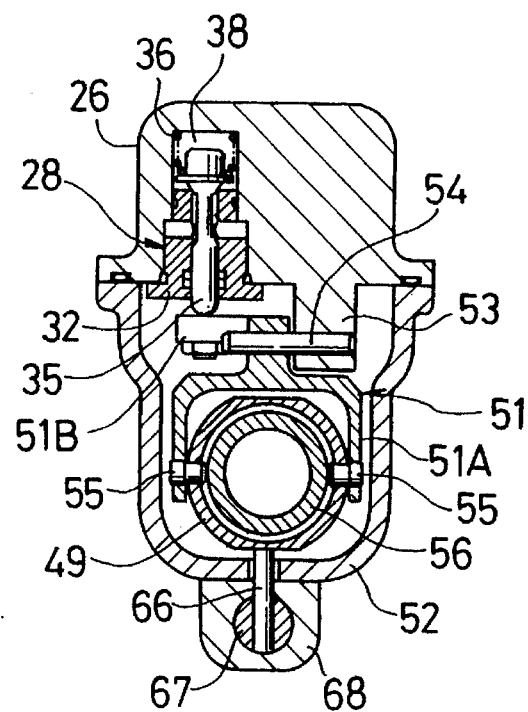
FIG. 3 is a sectional view taken along line III—III in FIG. 1.
Figure 4:
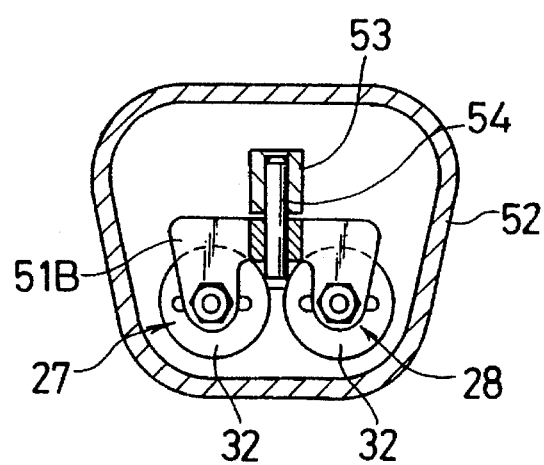
FIG. 4 is a sectional view taken along line IV—IV in FIG. 1.

The operation unit 48 includes a cable guide housing 52 as well as the cable guide 49 and the switching lever 51 noted above. The cable guide housing 52, as shown in FIGS. 1 and 3, is secured by bolts or the like to switching unit housing 26 such as to cover the first and second switching poppet valves 27 and 28. The cable guide 49 is slidably disposed in the cable guide housing 52. The switching lever 51 is supported rotatably through pin 54 to lever support 53 of the switching unit housing 26 for rotation around pin 54 in the directions of arrows O and P noted above. The switching lever 51, as shown in FIG. 3, has a bifurcated lower portion 51A, which is secured by set pins 55 to the cable guide 49. An upper portion 51B of the switching lever 51 as shown in FIG. 3 and in FIG. 4, is movable up to a position above the lower end of both the first and second switching poppet valves 27 and 28 so that it can push the poppets 35 thereof upward.

A core 56 which is connected to the inner cable 46A of the operating cable 46 is inserted through the cable guide 49. The core 56 and the piston 22 of the steering piston-and-cylinder assembly 13 are both connected to a clevis 57. The clevis 57 is coupled via a rod link 58 to the steering arm 18.

When the operating force of the steering wheel 43 is applied to the inner cable 46A of the operating cable 46 in the direction of arrow α, for instance, it acts via the core 56 and the clevis 57 to move the steering arm 18. At this time, a steering resistance force (which acts in the direction of arrow β, opposite to the direction of the operating force) acts on the inner cable 46A and the outer cable 46B by friction between these cables 46A and 46B. Thus, the cable guide 49 is moved in the direction of arrow β via the set pins 55. As a result, the switching lever 51 is rotated about the pin 54 in the direction of arrow O (FIG. 2), thus pushing the poppet 35 of the second switching poppet valve 28. Thus, the operating fluid supplied from the operating fluid supply pump 40 flows into the right chamber 25B, in the steering piston-and-cylinder assembly 13 to cause movement of the piston 21 and piston rod 22 in the direction of arrow M. The piston rod 22 applies a steering assist force to the steering arm 18 in the same direction as the force applied by steering wheel 43 via inner cable 46A and the core 56 to the steering arm 18.

The operation unit 48, as shown in FIG. 1, includes a neutral position restoration unit 59 for restoring the neutral position of the cable guide 49 when it has been moved slightly. The neutral position restoration unit 59 includes an outer groove 60 formed in the cable guide 49, a pair of movable members 62A and 62B fitted in the outer groove 60 to be forced by a compression spring 61 in a direction where these movable members 62A and 62B separate from each other, a housing cap 63 screwed in the cable guide housing 52 and locking the movable member 62B, and a retainer 65 screwed on the housing cap 63 and locking the other movable member 62A.

With slight sliding of the cable guide 49 the compression spring 61 is compressed, and the biasing force thereof acts on the cable guide 49 via the movable members 62A and 62B. When the steering resistance force acting on the cable guide 49 is removed, the guide cable 49 is thus restored to its neutral position, and the switching lever 51 is thus returned to the neutral position.

Figure 8:
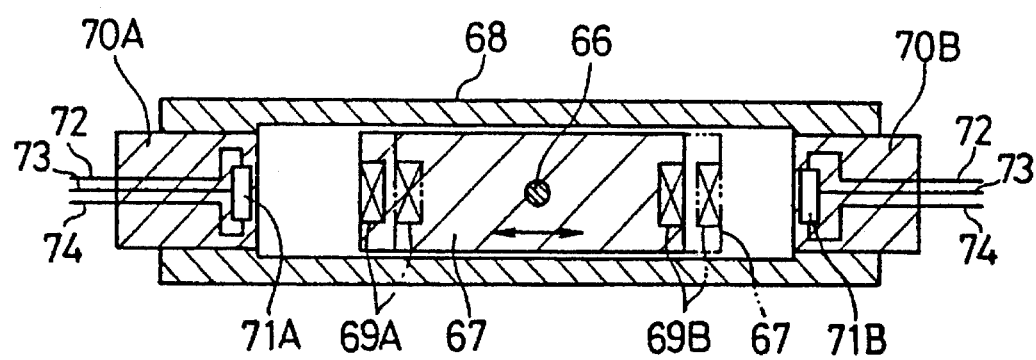
FIG. 8 is a sectional view taken along line VIII—VIII in FIG. 1.

As shown in FIGS. 1, 3 and 8, a magnet holder 67 is coupled via coupling pin 66 to the cable guide 49. The magnet holder 67 is slidable through a sensor housing 68, and it has magnets 69A and 69B provided at its opposite ends. With the sliding of the cable guide 49, the magnet holder 67 is thus caused to slide through the sensor housing 68 in the same direction and to the same extent as the cable guide 49.

The sensor housing 68 is provided with sensor holders 70A and 70B at the opposite ends in the sliding direction of the magnet holder 67. Hall ICs 71A and 71B are provided as Hall effect sensors on the respective sensor holders 70A and 70B. The Hall ICs 71A and 71B each have three terminals, i.e., a power supply terminal 72, an output signal terminal 73 and a grounding terminal 74, and these Hall ICs convert a change of the magnetic flux density to a change of the output voltage and output "on" and "off" signals to detect the magnetic flux density. For Hall ICs 71A and 71B, an operation magnetic flux density BOP and a restoration magnetic flux density BRP do not coincide, and a hysteresis is set as a characteristic of the output voltage corresponding to the magnetic flux density (FIG. 9).

Figure 9:
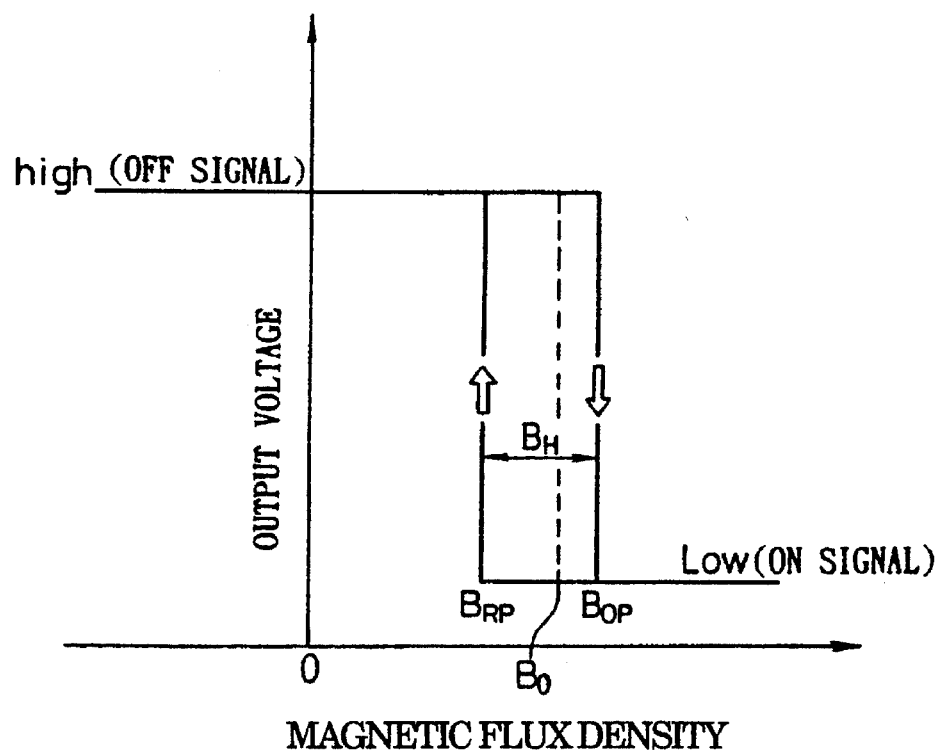
FIG. 9 is a graph showing an output characteristic of the Hall effect sensor (or Hall IC) shown in FIGS. 1, 3 and 8.

When the cable guide 49 pushes the switching lever 51 and is displaced to an extent sufficient to operate the first or second switching popper valve 27 or 28 via the switching lever 51 so that the magnetic flux density from the magnets 69A and 69B exceeds an operation magnetic flux density $B_{OP}$ as shown in FIG. 9, the Hall ICs 71A and 71B provide a "low" output voltage, i.e., an "on" signal. When the cable guide 49 is not displaced to an extent sufficient to operate the first or second switching poppet valve 27 or 28 so that the magnetic flux density from the magnets 69A and 69B is lower than a restoration magnetic flux density $B_{RP}$, the Hall ICs 71A and 71B provide a "high" output voltage, i.e., an "off" signal. According to the "on" or "off" signal from the Hall ICs 71A and 71B, a motor 75 (FIG. 6) is started or stopped to start or stop the operating fluid supply pump 40.

The width $B_H$ of the hysteresis region of the output characteristic of the Hall ICs 71A and 71B is specified to be approximately 15 Gauss as the width of the operation magnetic flux density $B_{OP}$ and the restoration magnetic flux density $B_{RP}$ in the direction of the magnetic flux density. In this embodiment, the displacement of the cable guide 49 is small so that the change in the magnetic flux density from the magnets 69A and 69B as received by the Hall ICs 71A and 71B does not exceed the hysteresis width $B_H$. That is, when the cable guide 49 is at its neutral position, at which neither the first or the second switching poppet valve 27 or 28 is operated, the magnetic flux density received by the Hall IC 71A or 71B is, for instance, shown at $B_0$ within the hysteresis width $B_H$.

Figure 10A:
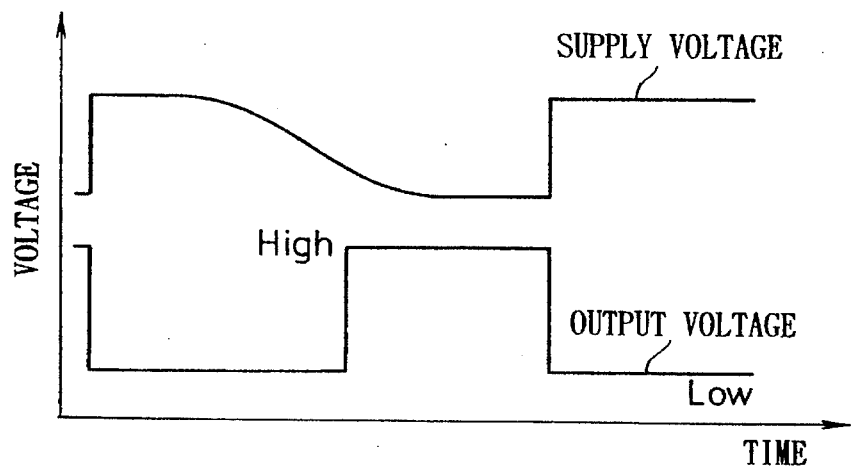
FIG. 10A is a graph showing, for the output characteristic shown in FIG. 9, an output voltage with respect to a supply voltage while the magnetic flux density is in a hysteresis region when the supply voltage is reduced fast.
Figure 10B:
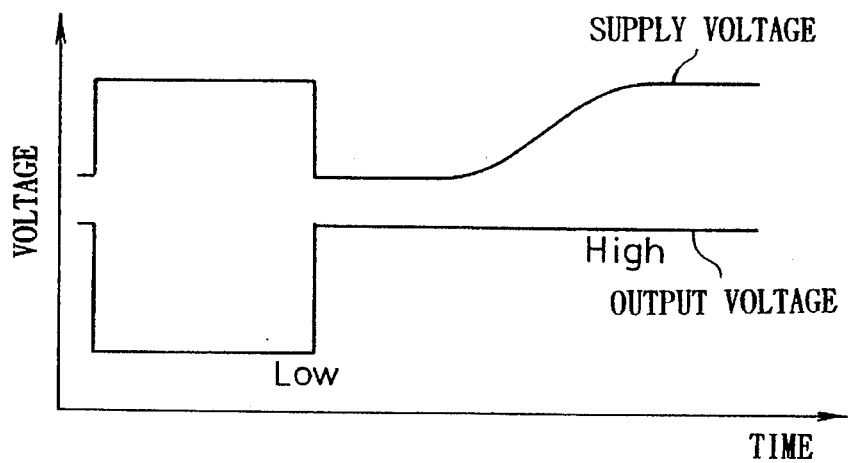
FIG. 10B is a graph showing, for the magnetoelectric conversion characteristic shown in FIG. 9, an output voltage with respect to a supply voltage while the magnetic flux density is in a hysteresis region when the supply voltage is reduced gradually.

In the meantime, when power to power supply terminal 72 is cut off suddenly or gradually and then supplied again suddenly as shown in FIG. 10A while the magnetic flux density which acts on the Hall IC 71A or the Hall IC 71B, between the operating magnetic flux density $B_{OP}$ and restoration magnetic flux density $B_{RP}$ (within the width $B_H$ of hysteresis), the Hall ICs 71A and 71B provide the "low" output voltage, i.e., the "on" signal from the output signal terminal 73 due to their circuit characteristics. However, when power to the power supply terminal 72 is cut off and then supplied gradually as shown in FIG. 10B while the magnetic flux density, which acts on the Hall IC 71A or the Hall IC 71B, remains unchanged within the width $B_H$ or hysteresis, the Hall ICs 71A and 71B provide the "high" output voltage, i.e., the "off" signal from the output signal terminal 73 due to their circuit characteristics.

Figure 6:
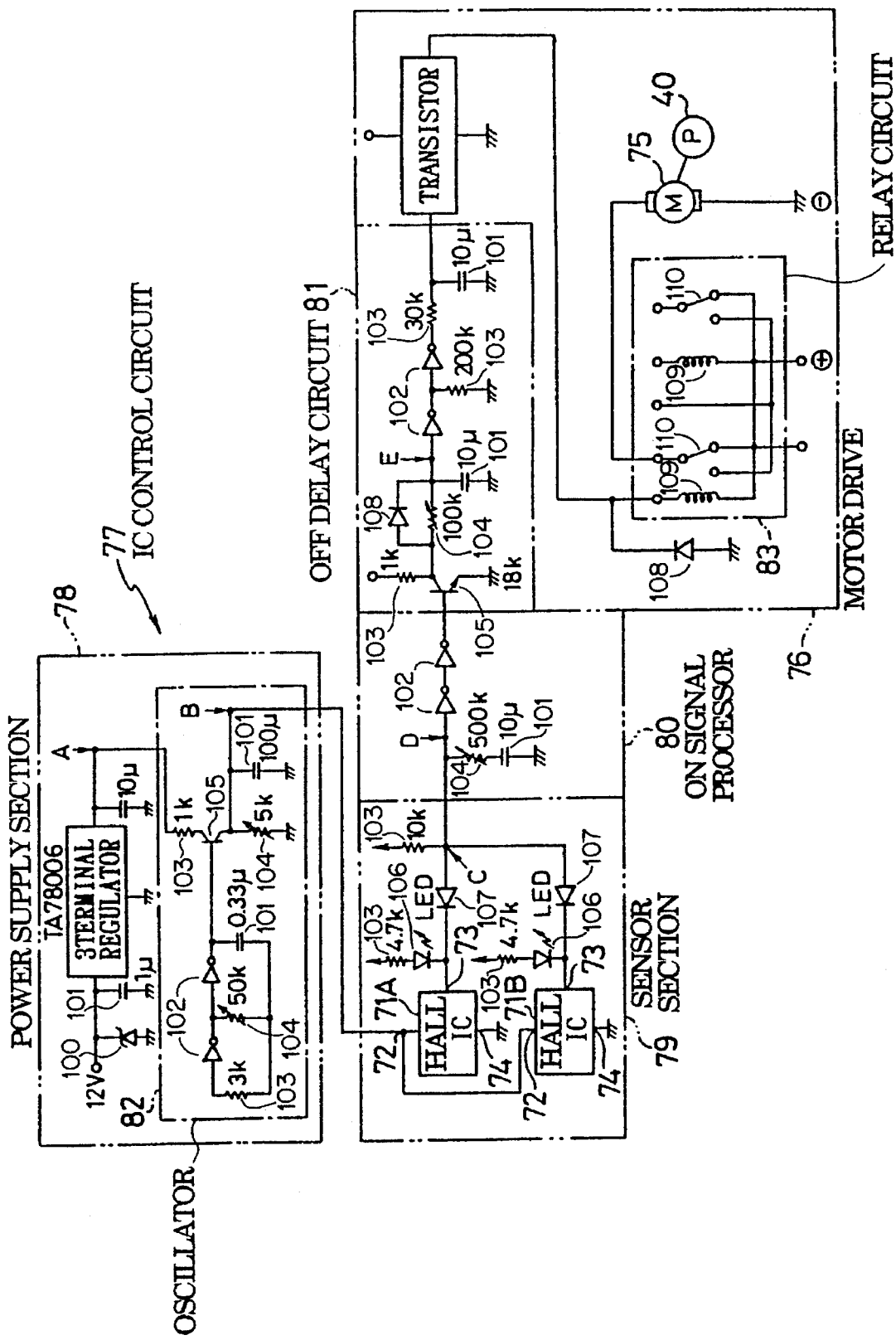
FIG. 6 is an electric circuit diagram showing a controller for a magnetoelectric conversion sensor (i.e., a Hall IC) shown in FIG. 1.

From the considerations of the small changes in the magnetic flux density received by the Hall ICs 71A and 71B and also of the characteristics of the Hall ICs 71A and 71B, a Hall IC control circuit 77 as shown in FIG. 6 is used, which is connected to a motor drive 76 for driving an electric motor 75. In the Hall IC control circuit 77, the power source supplied to the power supply terminal 72 of each of the Hall ICs 71A and 71B is oscillated, thereby reducing the hysteresis width $B_H$ of the Hall ICs 71A and 71B and permitting detection of slight displacement of the magnet holder 67, i.e., the cable guide 49.

The Hall IC control circuit 77 includes a power supply section 78 for supplying power to the power supply terminal 72 of each of the Hall ICs 71A and 71B, a sensor section 79 having the Hall ICs 71A and 71B, an "on" signal processor 80 connected to the sensor section 79, and an off-delay circuit 81 connected to the "on" signal processor 80 and also to the motor drive 76. As regards the circuit elements of the Hall IC control circuit 77 shown in FIG. 6, reference numerals 100 denote a Zener diode, 101 are various capacitors, 102 are various inverters, 103 are various resistors, 104 are various variable resistors, 105 are various transistors, 106 and 107 are respectively light emission diodes, 108 are various diodes, 109 are various coils, and 110 are switches. The above inverters 102 are arithmetic amplifiers which provide an output voltage having a reverse phase to the input voltage.

Figure 7A:
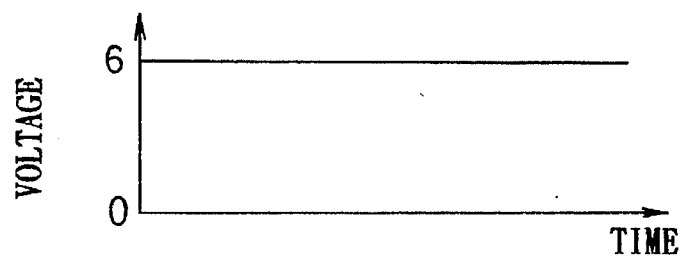
Figures 1, 7B:
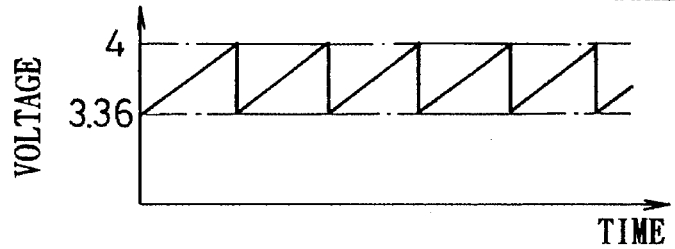
Figures 2, 7B:
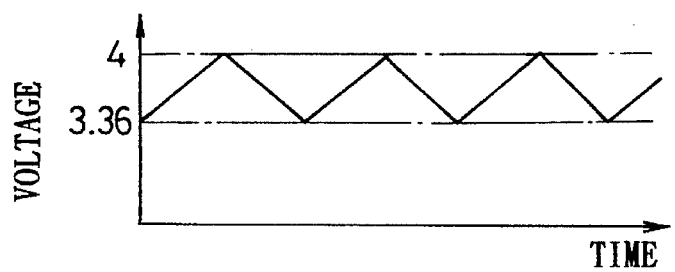

The power supply section 78 has an oscillator 82. The oscillator 82 converts a constant supply voltage at point A in the circuit, as shown in FIG. 7A, into a sawtooth oscillation wave as shown in FIG. 7B-1 or a triangular oscillation wave as shown in FIG. 7B-2. Such oscillation wave is at point B in the oscillator 82. Thus, the supply voltage is changed periodically in a predetermined range of about 3.36 to 4 V, and the voltage is increased gradually in the first half of each cycle.

With the oscillator 82 having such an oscillation waveform as discussed above impressed on the power supply terminal of each of the Hall ICs 71A and 71B, when the magnetic flux density acting on the Hall ICs 71A and 71B is reduced from the operating magnetic flux density $B_{OP}$ to a level in the range between the operating magnetic flux density $B_{OP}$ and restoration magnetic flux density $B_{RP}$ (i.e., the range corresponding to the hysteresis width $B_H$), for instance the level $B_0$ in FIG. 9, the Hall ICs 71A and 71B provide the "high" output voltage, i.e., the "off" signal. In this way, the width $B_H$ of the hysteresis of the Hall ICs 71A and 71B is reduced from the range between the operation magnetic flux density $B_{OP}$ and the restoration magnetic flux density $B_{RP}$ to the range between the operation magnetic flux density $B_{OP}$ and the magnetic flux density $B_O$. The Hall ICs 71A and 71B detect even a slight displacement of the magnet holder 67, i.e., the cable guide 49 and thus detect that the cable guide 49, i.e., the switching lever 51, is at the neutral position.

Figure 7C:
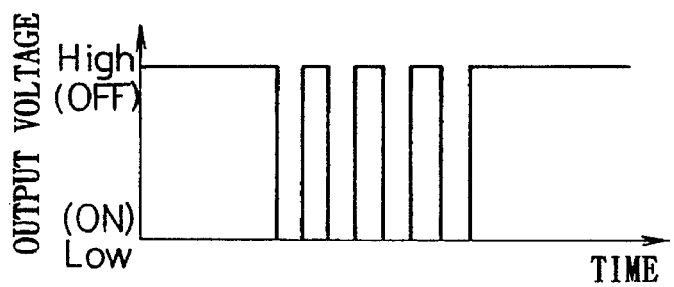
Figure 7D:
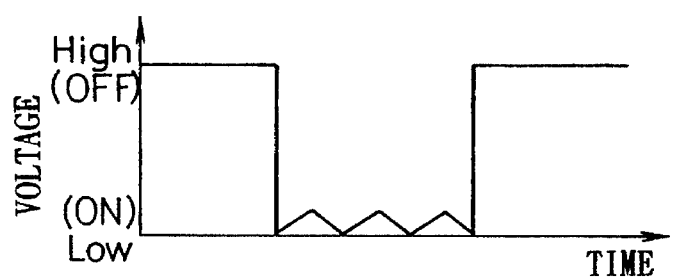

With the above supply power oscillation, the cable guide 49 is displaced to an extent sufficient to cause the switching lever 51 to operate the first or second switching poppet valve 27 or 28, and when the magnetic flux density received by the Hall IC 71A or 71B exceeds the operating magnetic flux density $B_{OP}$, the Hall IC 71A or 71B provides the "on" signal. This "on" signal assumes the "on" and "off" states repeatedly in accordance with the above supply power oscillation, as shown in FIG. 7C. The waveform in FIG. 7C appears at point C in FIG. 6. The "on" signal processing section 80 processes the "on" signal becoming "on" and "off" repeatedly as noted above to an "on" signal having a smoothing square waveform as shown in FIG. 7D and further inverts the "on" and "off" values. Its output is supplied through the off-delay circuit 81 to the motor drive 76. The waveform in FIG. 7D is of a signal at point D in FIG. 6. When the "off" signal is output from the Hall IC 71A and the Hall IC 71B, this "off" signal does not go to the "on" and "off" states, thereby differing from the "on" signal, and the "on" signal processing section 80 does not carry out waveform processing as for the "on" signal.

The motor drive 76 starts the electric motor 75 in response to the reception of the "on" signal noted above and stops the motor 75 in response to the reception of the "off" signal. In this way, it starts and stops the operating fluid supply pump 40. Thus, when no operating force is applied to the steering wheel 43, causing no displacement of the cable guide 49 and holding the switching lever 51 at the neutral position to hold both the first and second switching poppet valves 27 and 28 inoperative, the magnetic flux density, which acts on the Hall ICs 71A and 71B, remains in the width $B_H$ of the hysteresis and the Hall ICS 71A and 71B output the "off" signal, and the operating fluid supply pump 40 is stopped. Likewise, the operating fluid supply pump 40 is stopped with the cable guide 49 returned to the neutral position by the neutral position restoration unit 59 so that the first and second switching poppet valves 27 and 28 are inoperative. When an operating force is applied to the steering wheel 43 to cause displacement of the cable guide 49 so as to cause the switching lever 51 to operate either one of the first and second switching poppet valves 27 and 28, the magnetic flux density received by the Hall ICs 71A and 71B exceeds the operation magnetic flux density $B_{OP}$, the Hall ICs 71A and 71B output the "on" signal and the waveform of this "on" signal is processed by the "on" signal processing section 80. The operating fluid supply pump 40 is thus started simultaneously with the operation of the first or second switching poppet valve 27 or 28. Designated at 83 in FIG. 6 is a relay circuit which directly starts and stops the motor 75 in response to "on" and "off" signals from the off-delay circuit 81 through a transistor respectively.

Figure 7E:
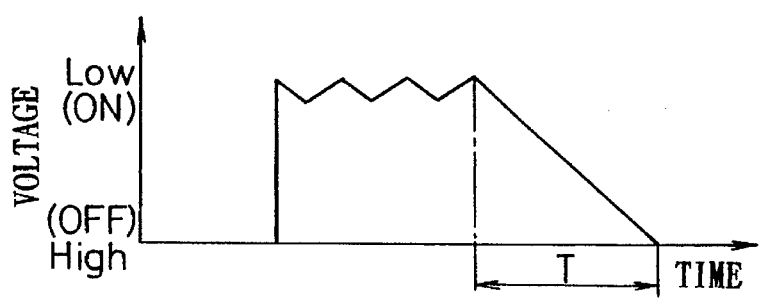

Since the operation unit 48 includes the neutral position restoration unit 59 as shown in FIG. 1, by slowly turning the steering wheel 43, the cable guide 49 is caused to repeat an operation of moving slightly, then returning to the neutral position, then moving slightly again, then returning to the neutral position again, and so forth. As a result, the operating fluid supply pump 40 is repeatedly started and stopped, so that the steering piston-and-cylinder assembly 13 may fail to generate the assist force. Accordingly, the signal from the "on" signal processing section 80 is supplied to the "off" delay section 81, in which a delay time T is set for the change of the "on" signal to the "off" signal as shown in FIG. 7E, thus delaying the "off" signal to delay the stop of the operating fluid supply pump 40. Thus, even by operating the steering wheel 43 slowly, the operating fluid supply pump 40 is started continuously to generate the steering assist force continuously. In this way, generation of a sense of abnormality of the steering wheel 43 is precluded.

The operation will now be described.

When the steering wheel 43 shown in FIG. 1 is turned neither to the left nor to the right, the cable guide 49 is not displaced via the operating cable 46. Thus, the magnet holder 67 is not displaced. The Hall ICs 71A and 71B thus provide the "off" signal, and the operating fluid supply pump 40 is stationary. At this time, the switching lever 51 is at the neutral position, and the first and second switching poppet valves 27 and 28 are inoperative. Thus, the oil hydraulic pressures in the left and right chambers 25A and 25B in the steering piston-and-cylinder assembly 13 are in equilibrium. Consequently, the piston rod 22 of the steering piston-andcylinder assembly 13 is not moved, and no assist force from the steering piston-and-cylinder assembly 13 is applied to the steering arm 18.

When the steering wheel 43 shown in FIG. 1 is turned to the left, the inner cable 46A of the operating cable 46 is moved in the direction of arrow α. Also, the outer cable 46B is moved in the direction of arrow β by the steering resistance force, and the cable guide 49 is also moved in the direction of arrow β. With the movement of the cable guide 49 the switching lever 51 is rotated in the direction of arrow O in FIG. 2 to operate the second switching poppet valve 28 so as to communicate the ports 30 and 39 of the second switching poppet valve 28 with each other. As a result, the operating fluid from the operating fluid supply pump 40 is led through the ports 30 and 31 of the first switching poppet valve 27 to the right chamber 25B of the steering piston-and-cylinder assembly 13. On the other hand, the operating fluid in the left chamber 25A is led through the ports 30 and 39 of the second switching poppet valve 28 to the drain tank 42. Thus, the piston 21 and piston rod 22 of the steering piston-and-cylinder assembly 13 are moved (i.e., accommodated) in the direction of arrow M, and a left steering assist force is applied to the steering arm 18.

When the steering wheel 43 shown in FIG. 1 is turned to the right, the cable guide 49 is displaced in the direction opposite to the above β direction. The Hall IC 71A thus outputs the "on" signal to start the operating fluid supply pump 40, while at the same time causing the switching lever 51 to be rotated in the P direction in FIG. 2 to operate the first switching poppet valve 27. As a result, the operating fluid from the operating fluid supply pump 40 is led through the ports 30 and 39 of the first switching poppet valve 27 to the left chamber 25A of the steering piston-and-cylinder assembly 13, and the operating fluid in the right chamber 25B is led through the ports 31 and 39 of the first switching poppet valve 27 to the left chamber 25A of the steering piston-and-cylinder assembly 13. Thus, the piston 21 and piston rod 22 of the steering piston-and-cylinder assembly 13 are moved (i.e., advanced) in the direction of arrow N. A right steering assist force is thus applied to the steering arm 18.

Among the prior art steering systems for boat propelling apparatus are those disclosed in Tokkai Hei 2-147497 (U.S. Pat. No. 4,976,639) and U.S. Pat. No. 4,595,370. In such a steering system, a propelling unit having a propeller is steerably supported on the boat, and a steering piston-and-cylinder assembly is secured to the boat. The steering piston-and-cylinder assembly has its piston rod coupled to a steering arm which can steer the propelling unit. An operation cable which is coupled to a steering wheel provided in the boat, is secured to the steering arm. The operation cable operates a spool valve in an oil hydraulic operating fluid switching unit for switching the flow of operating fluid supplied to the steering piston-and-cylinder assembly. The operating force of the steering wheel is transmitted to the operation cable, whereby the spool valve of the operating fluid switching unit is moved to switch the flow of operating fluid to the steering piston-and-cylinder assembly. Thus, the propelling unit is steered by the operating fluid pressure of the steering piston-and-cylinder assembly.

In the above steering system for the boat propelling apparatus, however, the operating fluid switching unit has a switching section comprising a spool valve. This means that a play in the sliding of the spool is formed between the spool and a sleeve. Therefore, when an external force is applied to the propelling unit at the time of generation of a steering assist force by the steering piston-and-cylinder assembly, the operating fluid may be caused to flow through the play, thus making the steering unsteerable.

In the above embodiment, in which the switching section of the operating fluid switching unit 19 comprises the first and second switching poppet valves 27 and 28, compared to the case of the switching section constituted by the spool valve, the leak of operating fluid can be drastically reduced between the port 30 or 31 and the port 39 in the first or second switching poppet valve 27 or 28. Thus, when an external force is applied to the propelling unit 12 during the steering, the piston 21 and piston rod 22 of the steering piston-and-cylinder assembly 13 are not operated, and the propelling unit 12 does not react under the influence of the external force. It is thus possible to ensure the stability of steering.

Further, when a voltage supplied to the Hall ICs 71A and 71B serving as the Hall effect sensors is decreased once, then gradually increased while the magnetic flux density received by the Hall ICs 71A and 71B remains unchanged in the width $B_H$ of hysteresis between the operation magnetic flux density $B_{OP}$ and the restoration magnetic flux density $B_{RP}$, the Hall ICs 71A and 71B provide the "high" output voltage, i.e., the "off" signal due to the circuit characteristics thereof. By applying a voltage, which is varied cyclically in a predetermined range and gradually increased in the first half part of each cycle, to the Hall ICs 71A and 71B, the Hall ICs 71A and 71B provide the "off" signal while the magnetic flux density received by the Hall ICs 71A and 71B remains unchanged in the width $B_H$ of hysteresis between the operation magnetic flux density $B_{OP}$ and the restoration magnetic flux density $B_{RP}$. It is, thus, possible to reduce the hysteresis width $B_H$ of the output characteristics of the output voltage (i.e., "on" and "off" signals) with respect to the magnetic flux density. Thus, it is possible to detect even a slight change in the magnetic flux density to detect a slight displacement of the cable guide 49 so as to start or stop the operating fluid supply pump 40.

Further, since the operating fluid path 29 is provided with the check valve 41 between the port 30 of the first switching popper valve 27 and the operating fluid supply pump 40, when an external force is applied to the piston rod 22 of the steering piston-and-cylinder assembly 13 via the propelling unit 12 in the neutral state with the operating fluid supply pump 40 stopped and without any assist force provided from the steering piston-and-cylinder assembly 13, it is possible with the state of closure of the valve section 34 of the first switching poppet valve 27 and the valve seat 37 and also with the check valve 41 to block the flow of operating fluid from the left and right chambers 25A and 25B of the steering piston-and-cylinder assembly 13. It is thus possible to hold the propelling unit 12 stationary in the neutral state irrespective of application of an external force to the propelling unit 12.

Now a first and second modification of the steering system for a boat propelling apparatus will be described with reference to FIGS. 11 and 12. In these modifications, parts like those in the preceding embodiment are designated by like reference numerals and symbols, and they are not described any further.

As shown in FIG. 11, the first modification of the steering for a boat propelling apparatus comprises an operating fluid switching unit 84, which includes a pair of, i.e., a third and a fourth, switching poppet valves 85 and 86 in addition to the first and second switching poppet valves 27 and 28. The first and second switching poppet valves 27 and 28 constitute a switching section 87 for switching the flow of operating fluid directed from the operating fluid supply pump 40 to the steering piston-and-cylinder assembly 13 and the flow of operating fluid directed from the steering piston-and-cylinder assembly 13 to the drain tank 42. The third and fourth switching poppet valves 85 and 86, on the other hand, constitute a drain control section 88 to control the flow of operating fluid directed from the operating fluid supply pump 40 to the drain tank 42.

The third switching poppet valve 85 has the same structure as the second switching poppet valve 28, and the fourth switching poppet valve 86 has the same structure as the first switching poppet valve 27. The third switching poppet valve 85, as shown in FIG. 12B, is provided on the same side as the second switching poppet valve 28 with respect to the support pin 54. The fourth switching popper valve 86 is provided on the same side as the first switching poppet valve 27 with respect to the support pin 54.

Figure 12A:
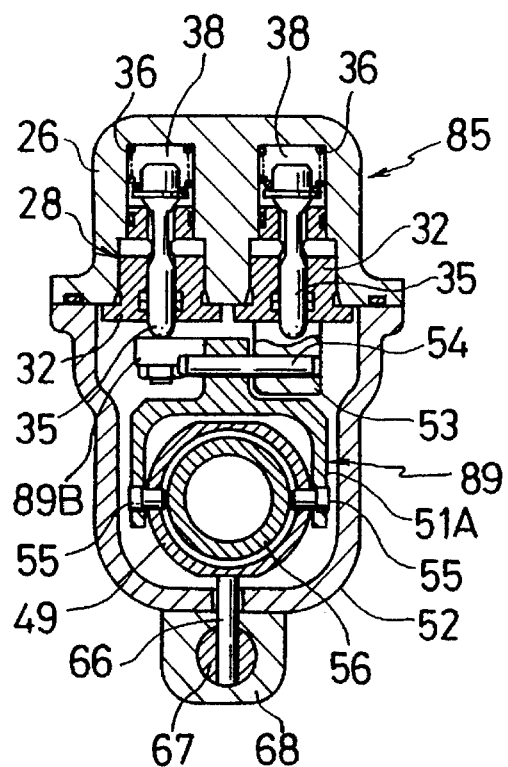
FIG. 12A is a sectional view similar to FIG. 3 but showing the first modification shown in FIG. 11.
Figure 12B:
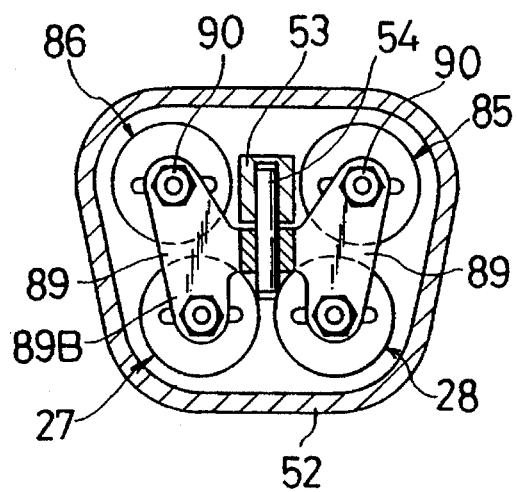
FIG. 12B is a sectional view similar to FIG. 4 but showing the same first modification.

The switching lever 89 as shown in FIG. 12A, has an upper portion 89B, which, as shown in FIG. 12B, extends in four directions to be below the poppets 35 of the first to fourth switching poppet valves 27, 28, 85 and 86. Adjustment screws 90 are each screwed in each of end portions of the upper portion 89B that extend to the third and fourth switching poppet valves 85 and 86. The end of the adjustment screws 90 are pushing the poppet 35 of the third and fourth switching poppet valves 85 and 86 at all times. Thus, in the third and fourth switching poppet valves 85 and 86, the valve section 34 is normally spaced apart from the valve seat 37. In this state, the ports 30 and 31 of the fourth switching poppet valve 86 are in communication with the port 39 thereof, while the ports 30 and 39 of the third switching poppet valve 85 are in communication with each other. In other words, the third and fourth switching poppet valves 85 and 86 are normally open valves.

When the switching lever 89 is rotated about the support pin 54 in the direction of arrow O, the second switching poppet valve 28 and the third switching poppet valve 85 are operated. When the switching lever 89 is rotated about the support pin 54 in the direction of arrow P, on the other hand, the first switching poppet valve 27 and the fourth switching poppet valve 86 are operated. The third and fourth switching poppet valves 85 and 86 are adjusted by the adjustment screws 90 such that they are operated by a predetermined delay time with respect to the operation of the first and second switching poppet valves 27 and 28. The predetermined delay time noted above is increased by increasing the extent of projection of the adjustment screws 90.

Thus, when no operating force is applied to the steering wheel shown in FIG. 1, the switching lever 89 is at its neutral position. The first to fourth switching poppet valves 27, 28, 85 and 86 are thus in the inoperative state. In this state, the Hall ICs 71A and 71B are providing the "off" signal, and the operating fluid supply pump 40 is stopped.

When an operating force is applied to the steering wheel 43, the cable guide 49 is displaced via the operating cable 46. Thus, the Hall ICs 71A and 71B provide the "on" signal to start the operating fluid supply pump 40. At the same time, with the displacement of the cable guide 49 the switching lever 89 is rotated in the direction of arrow O or P to operate the first or second switching poppet valve 27 or 28. After the lapse of a predetermined period of time from this instant of operation, the third or fourth switching poppet valve 85 or 86 is operated.

In an initial stage after the start of the operating fluid supply pump 40, the operating fluid therefrom partly flows to the third and fourth switching poppet valves 85 and 86, while the remainder of the operating fluid flows to the first or second switching poppet valve 27 or 28. When the third or fourth switching poppet valve 85 or 86 is closed after the lapse of the predetermined time, the operating fluid from the operating fluid supply pump 40 all flows to the first or second switching poppet valve 27 or 28. Thus, at the time of the start of the operating fluid supply pump 40 the operating fluid will not suddenly flow through the first or second switching popper valve 27 or 28 in the switching section 87 into the steering piston-and-cylinder assembly 13. Thus, at the time of the start of the operating fluid supply pump 40 the assist force generated by the steering piston-and-cylinder assembly 13 can be smoothly increased, thus ensuring a smooth steering characteristic.

A second modification of the steering system for a boat propelling apparatus according to the invention will now be described. In this instance, the operating fluid switching unit has the same structure as the operating fluid switching unit 84 in the second embodiment shown in FIG. 11, and the operating fluid supply pump 40 is operative at all times. In this case, when the Hall IC 71A or 71B provides the "off" signal, the motor drive 76 shown in FIG. 6 causes low speed rotation of the operating fluid supply pump 40. When the Hall IC 71A or 71B provides the "on" signal, the motor drive 76 causes normal high speed rotation of the operating fluid supply pump 40.

When there is no operating force acting on the steering wheel 43 so that the cable guide 49 and the switching lever 89 are held in their neutral positions, the operating fluid supply pump 40 is rotating at low speed, and none of the first to fourth switching poppet valves 27, 28, 85 and 86 is operative. In this state, the operating fluid from the operating fluid supply pump 40 is forced, as shown in FIG. 11, from the port 39 of the fourth switching poppet valve 86 through the port 30 thereof and the ports 30 and 39 of the third switching poppet valve 85 to the drain tank 42.

When an operating force is acted on the steering wheel 43, the cable guide 49 is displaced, causing the Hall IC 71A or 71B to provide the "on" signal to cause high speed rotation of the operating fluid supply pump 40 while also operating the switching lever 89 to close the third or fourth switching poppet valve 85 or 86 and operate the first or second switching poppet valve 27 or 28. Thus, the operating fluid from the operating fluid supply pump 40 flows through the first or second switching poppet valve 27 or 28 to the left or right chamber 25A or 25B of the steering piston-and-cylinder assembly 13, thus causing an assist force to be applied to the steering arm 18.

In the above second modification of the steering for a boat apparatus, since the operating fluid supply pump 40 is operative at all times, there is no delay in starting of the operating fluid supply pump 40 with respect to the operation of the cable guide 49 in the operation unit 84. It is thus possible to lead operating fluid smoothly through the first or second switching poppet valve 27 or 28 to the steering piston-and-cylinder assembly 13. It is thus possible to generate the steering assist force from the steering piston-and-cylinder assembly 13 quickly and smoothly in response to operation of steering wheel 43.

In connection with the above-described embodiment and first and second modifications thereof, it is possible to provide adjustment screws 90 on end portions of the switching lever 51 or 89 corresponding to the first and second switching poppet valves 27 and 28. Also, in the second modification, the switching lever 89 of the operating fluid switching unit 84 is not provided with any adjustment screw 90 so as to directly push the poppets 35 of the third and fourth switching poppet valves 85 and 86.

While the embodiment and first and second modification thereof have been described with reference to the drawings, they are by no means limitative, and various changes and modifications are possible without departing from the scope and spirit of the invention.

What is claimed is:

1. A controller for a Hall effect sensor comprising:

a sensor section including a Hall effect sensor which detects a magnetic flux density and converts a change of magnetic flux density to a change of an output voltage to produce an output electric signal, said Hall effect sensor having a hysteresis which is set as an output characteristic of the output voltage corresponding to the magnetic flux density;

a power supply section connected to said sensor section to supply a power source to the Hall effect sensor;

a signal processing section connected to said sensor section to process the output electric signal produced by said sensor section; and said power supply section supplies to the Hall effect sensor power which cyclically changes in a range of specified value in a positive or negative area and gradually increases in a first half of each cycle such that said Hall effect sensor outputs an "off" signal when the magnetic flux density which acts on the Hall effect sensor remains in a width of the hysteresis and an "on" signal when the magnetic flux density remains above an upper limit of the width of the hysteresis.

2. A controller for a Hall effect sensor according to claim 1, wherein said signal processing section processes the "on" signal, which is output from the Hall effect sensor and cyclically changes, to a smoothing square waveform.

3. The controller for a Hall effect sensor according to claim 1, wherein the voltage which is varied cyclically in a predetermined range and is increased gradually, has a sawtooth oscillation waveform.

4. The controller for a Hall effect sensor according to claim 1, wherein the voltage which is varied cyclically in a predetermined range and is increased gradually, has a triangular oscillation waveform.

5. A controller for a Hall effect sensor according to claim 1, wherein said Hall effect sensor is a Hall IC.

* * * * *